United States Patent [19]
Burr

[11] Patent Number: 5,985,727
[45] Date of Patent: Nov. 16, 1999

[54] METHOD FOR FORMING MOS DEVICES WITH RETROGRADE POCKET REGIONS AND COUNTER DOPANT REGIONS BURIED IN THE SUBSTRATE SURFACE

[75] Inventor: James B. Burr, Foster City, Calif.

[73] Assignee: Sun Microsystems, Inc., Palo Alto, Calif.

[21] Appl. No.: 08/885,071

[22] Filed: Jun. 30, 1997

[51] Int. Cl.$^6$ .................................................. H01L 21/336
[52] U.S. Cl. .......................... 438/302; 438/303; 438/305
[58] Field of Search ...................................... 438/302–305

[56] References Cited

U.S. PATENT DOCUMENTS

| | | |
|---|---|---|
| 4,939,571 | 7/1990 | Nishizawa et al. . |
| 4,949,140 | 8/1990 | Tam . |
| 5,536,959 | 7/1996 | Kellam . |
| 5,650,340 | 7/1997 | Burr et al. ................................. 437/40 |
| 5,753,958 | 5/1998 | Burr et al. ............................... 257/392 |
| 5,773,863 | 6/1998 | Burr et al. ............................... 257/344 |

FOREIGN PATENT DOCUMENTS

| | | |
|---|---|---|
| 1-37055 | 2/1989 | Japan . |

OTHER PUBLICATIONS

R. H. Yan et al., "High Performance 0.1–micron Room Temperature Si MOSFETs", Symposium on VLSI Technology Digest of Technical Papers, pp. 86–87, 1992. Month Unknown.

M. Aoki et al., "0.1–micron CMOS Devices Using Low–Impurity Channel Transistors (LICT)", pp. 9.8.1.–9.8.3, IEDM, 1987. Month Unknown.

Hisao Yoshimura et al., "New CMOS Shallow Junction Well FET Structure (CMOS–SJET) for Low–Power Suppy Voltage", Semiconductor Device Engineering Laboratory, Japan, Proceedings of IEDM, pp. 909–912, 1992. Month Unknown.

James B. Burr et al., "Energy Considerations in Multichip–Module based Microprocessors", IEEE International Conference on Computer Design, pp. 593–600, 1991. Month Unknown.

J. Burr et al., "Ultra Low Lower CMOS Technology", NASA VLSI Design Symposium, pp. 4.2.1–4.2.13, 1991. Month Unknown.

Jim Burr, "Stanford Ultra Low Power CMOS", Symposium Record, Hot Chips V, pp. 7.4.1–7.4.12, Stanford, CA, 1993. Month Unknown.

"A New Lease on Life for Old–Fashioned Chips", Business Week, Science and Technology, pp. 100–101, Dec. 20, 1993.

James B. Burr et al., "A 200mV Self–Testing Encoder/Decoder Using Stanford Ultra–Low Power CMOS", IEEE International Solid State Circuits Conference, 1994. Month Unknown.

(List continued on next page.)

*Primary Examiner*—John F. Niebling
*Assistant Examiner*—Michael S. Lebentritt
*Attorney, Agent, or Firm*—Jones Volentine, LLP

[57] ABSTRACT

Disclosed is a low threshold asymmetric MOS device having a pocket region with a graded concentration profile. The pocket region includes a relatively high dopant atom concentration (of the same conductivity type as the bulk region) abutting either the device's source or its drain along the side of the source or drain that faces the device's channel region. The pocket region's graded concentration profile provides a lower dopant concentration near the substrate surface and an increasing dopant concentration below that surface. This provides a relatively low resistance conduction path through the pocket region, while allowing the device's threshold voltage to be somewhat higher at the pocket region. The asymmetric device can also include a counter dopant region located beneath its substrate surface. This forces current to flow in the substrate but just above the region of high counter dopant concentration, where the resistance is relatively low.

13 Claims, 9 Drawing Sheets

OTHER PUBLICATIONS

Meeting Notes by Dr. James B. Burr et al., Feb. 25, 1994. (After giving talk at an annual Hitachi seminar held in Stanford, CA, Dr. Burr had dinner with M. Nagata, K. Sasaki, H. Hiraki and O.Nishii of Hitachi Corp., and Dr. Burr discussed his work on low threshold voltage COMS devices. During dinner, one of the gentlemen from Hitachi sketched some notes and figures showing possible MOS device structures (Exhibit A). One sketch shown appears to be an NMOS device having "p++" regions under both the source and drain.).

Yoshinori Okumura et al., "Source–to–Drain Nonuniformly Doped Channel (NUDC) MOSFET Structures for High Current Drivability and Threshold Voltage Controllability", IEEE Transactions on Electron Devices, vol. 39, No. 11, pp. 2541–2552, Nov. 1992.

George A. Sai–Halasz et al., "High Transconductance and Velocity Overshoot in NMOS Devices at the 0.1–micron Gate–Length Level", IEEE Electron Device Letters, vol. 9, No. 9, pp. 464–466, Sep. 1998.

R. Jayaraman et al., "Comparison of High Voltage Devices for Power Integrated Circuits", IEDM, pp. 258–261, 1984. Month Unknown.

Junko Tanaka et al., "A Sub–0.1–micron Grooved Gate MOSFET with High Immunity to Short–Channel Effects", IEEE Transactions on Electronic Devices, vol. 42, No. 3, pp. 537–540, Mar. 1995.

Wen–Ling Margaret Huang et al., "TFSOI Complementary BiCMOS Technology for Low Power Applications", IEEE Transactions on Electronic Devices, vol. 42, No. 3, pp. 506–512, Mar. 1995.

W.R. Hunter et al., "A New Edge–Defined Approach for Submicrometer MOSFET Fabrication", IEEE Electron Device Letters, vol. EDL–2, No. 1, Jan. 1981.

METHOD FOR FORMING MOS DEVICES WITH RETROGRADE POCKET REGIONS AND COUNTER DOPANT REGIONS BURIED IN THE SUBSTRATE SURFACE

CROSS-REFERENCE TO RELATED APPLICATIONS

This application is related to: U.S. patent application Ser. No. 08/357,436, filed Dec. 16, 1994, entitled ASYMMETRIC LOW POWER MOS DEVICES, and naming Burr and Brassington as inventors; U.S. patent application Ser. No. 08/884,286, filed Jun. 27, 1997, entitled NOTCHED GATE OXIDE ASYMMETRIC MOS DEVICES, and naming James Burr as inventor; U.S. patent application Ser. No. 08/884,152, filed Jun. 27, 1997, entitled SPLIT GATE OXIDE ASYMMETRIC MOS DEVICES and naming James Burr as inventor; U.S. patent application Ser. No. 08/883,829, filed Jun. 27, 1997, entitled, METHOD FOR FORMING A NOTCHED GATE OXIDE ASYMMETRIC MOS DEVICE and naming James Burr as inventor; U.S. patent application Ser. No. 08/882,102, filed Jun. 30, 1997, entitled MOS DEVICES WITH RETROGRADE POCKET REGIONS and naming James Burr as inventor; U.S. patent application Ser. No. 08/885,071, filed Jun. 30, 1997, entitled, METHOD FOR FORMING MOS DEVICES WITH RETROGRADE POCKET REGIONS AND COUNTER DOPANT REGIONS AT THE SUBSTRATE SURFACE and naming James Burr as inventor; all of which are assigned to the assignee of the present invention and incorporated herein by reference in their entirety for all purposes.

BACKGROUND OF THE INVENTION

The present invention generally relates to high performance MOS devices, and more specifically to asymmetric MOS transistors.

In digital MOS circuits, performance may be approximated by the ratio of drive current through the circuit to the load being switched by the circuit.

$$f = I/Q$$

In this expression, I is equal to the drive current through the transistors in the circuit, Q is the charge on the output of a circuit (the load), and f is the operating frequency of the circuit, which is a measure of performance. Thus, a digital circuit's performance can be improved by increasing its drive current and/or decreasing its load.

The drive current in a given transistor is given by the following expression:

$$I = \rho v$$

Here, $\rho$ represents the linear charge density (or charge per unit length) in an MOS device channel and $v$ represents the average velocity of the charge carriers in that channel. Thus, current can be increased by increasing either the linear charge density, the charge carrier average velocity, or both along a device's drive current path.

Charge carriers in conventional MOS devices move in one of two velocity regimes demarcated by the field strength across the device channel. The first regime, known as subsaturation, is encountered at relatively low lateral field strengths, such as are commonly found in long channel devices (e.g., devices in which the effective channel length is greater than about 2 $\mu$m). Here velocity increases linearly with the lateral field, e, across the channel. As the lateral field increases, so does the charge carrier velocity. At some point, however, the second velocity regime is reached: a regime referred to as "saturation." Here the increasing lateral field strength has reached or exceeded a critical field strength (ecritical) at which the velocity is no longer a linear function of field strength. Rather the carrier velocity remains constant at a "saturation velocity" (vsat) with increasing field strength. Both vsat and ecritical are material properties of the semiconductor in which conduction takes place.

Physically, at velocity saturation, the carriers have reached a fundamental limit in velocity as determined by their interactions with optical phonons of the semiconductor lattice. Thus, it may appear that performance is limited by the saturation velocity. In fact, however, a third velocity regime exists: ballistic transport. This regime exists in systems where the mean free path of the charge carriers is on the order of the distance that the carriers must travel. In single crystal silicon, the mean free path for most electrons is on the order of about 1000 Å or less. At these distances, phonons do not mediate charge carrier transport. Rather, the carriers accelerate under the applied lateral field as if they were in a vacuum so that their velocity increases in proportion to the square root of the potential. Thus at relatively moderate potentials, ballistic electrons can reach velocities greatly exceeding saturation velocity.

Not surprisingly, devices in which ballistic transport plays a significant role may possess greatly improved performance. For silicon-based MOS technology, such devices would have to have an effective channel length of about 0.1 $\mu$m (1000 Å) or less. Unfortunately, conventional optical lithography techniques (which are employed to manufacture most MOS integrated circuits today) likely can not produce such small feature sizes without great effort.

Recently, asymmetric MOS devices fabricated by conventional optical lithographic techniques have been proposed (see the above-referenced U.S. patent application Ser. No. 08/357,436). The channel region in such devices likely can be made short enough that some electrons will move by ballistic transport. These devices include, in addition to conventional MOS device elements, a pocket region of relatively high dopant concentration abutting either the device's source or drain along the side of the source or drain that faces the device's channel region. Because the pocket region abuts only one of the source or drain, the device is deemed "asymmetric."

As explained in U.S. patent application Ser. No. 08/357,436, the pocket region locally increases the threshold voltage of the device over a very small portion of the channel region. Thus, it is believed that such asymmetric devices behave like two pseudo-MOS devices in series: a "source FET" and a "drain FET," one of which has a higher threshold voltage by virtue of the pocket region. An asymmetric MOS device having such structure will switch as follows. At a very low (typically less than −1 volt for an NFET) gate voltage, neither the shorter nor longer channel pseudo-device is switched "on." That is, neither pseudo-device's channel region has undergone inversion. However, at slightly higher gate potentials, in the range where MOS devices are normally switched off (e.g., slightly above −1 volt), the threshold of the longer channel pseudo-device is exceeded, and that device therefore has switched on. Nevertheless, such gate voltages still do not exceed the level at which the shorter channel pseudo-device switches on. Thus, no current yet flows between the source and drain. As the gate voltage increases and surpasses the shorter channel pseudo-device's threshold voltage (typically at about 0 volts), that device also switches on allowing current to flow between the source and drain. In short, the device switches on in two stages, and does not completely switch on until the gate voltage exceeds the short channel pseudo-device's threshold voltage.

If an asymmetric MOS device is operated such that the "on" gate voltage only slightly exceeds the threshold voltage of the shorter channel pseudo-device, the performance of the overall MOS device will be governed by the performance of that pseudo-device. This is very desirable if the shorter channel pseudo device has an effective channel length on the order of 1000 Å or less. As noted, at such short lengths, some charge carriers move across the channel ballistically.

To realize maximum performance, the above-described asymmetric MOS device should switch at a very low gate voltage, near 0 volts. Various techniques for adjusting threshold voltage are known. For example, employing low concentrations of dopant in the channel region of a MOS device will result in a low threshold voltage. Thus for a NMOS device, lowering the p-type dopant concentration in the channel region (while fixing all other relevant variables) lowers the device's threshold voltage. Very low thresholds (on the order of 0 volts or lower) can be achieved by "counter doping" the channel region. Counter doping involves adding dopant atoms of conductivity type opposite that of the bulk dopant to the device channel region. In a NMOS device, for example, the channel region can be counter doped with n-type dopant to dramatically reduce the device threshold.

While counter doping reduces threshold voltage, and thereby theoretically improves performance in active circuits, it can also increase the resistance in the channel region. This additional resistance is due to decreased charge carrier mobility from impurity scattering in the channel region conduction path. As dopant atoms are the primary impurities causing such scattering, the effect is most pronounced in the pocket region, where both counter dopant and pocket dopant atoms reside. Unfortunately, the increased resistance can partially or completely offset any advantage provided by a lower threshold, especially in devices with low supply voltages (Vdd). As device design trends are currently moving to lower supply voltages, some technique for reducing the conduction path resistance is necessary if the potential advantages of counter doping are to be realized in asymmetric devices.

SUMMARY OF THE INVENTION

The present invention provides low threshold asymmetric MOS devices having a pocket region engineered with a graded dopant atom concentration profile. In such devices, the pocket region has a relatively low dopant concentration near the substrate surface and a higher dopant concentration below that surface. By employing a low dopant concentration near the surface, the channel region maintains a low resistivity conduction path through the pocket region. Further, by employing a higher dopant concentration below the surface, the device's local threshold voltage is somewhat higher near the pocket region. The resulting device has the advantage of short channel asymmetric devices (described above) without the disadvantage of a high resistance conduction path.

One aspect of the present invention provides an asymmetric MOS device formed on a semiconductor substrate. The device can be characterized as including the following elements: (1) a bulk region having an average dopant concentration of a first conductivity type; (2) source and drain regions of a second conductivity type positioned within the bulk region and separated by a channel region; (3) a gate positioned over the channel region; and (4) a pocket region of the first conductivity type abutting one of the source or drain regions and extending into a portion of the channel region. The concentration of dopant atoms of the first conductivity type in the pocket region should have a retrograde profile that increases with distance from the semiconductor substrate top surface such that the concentration of dopant atoms of the first conductivity type is lower in the channel region than in a region immediately below the channel region. Thus, the maximum dopant atom concentration in the pocket region should reside beneath the channel region. The advantages of this invention are most pronounced in low threshold voltage devices characterized by a ratio of on current to off current (leakage current) which is not greater than about $10^5$. Generally, such devices will have a threshold voltage of between about −150 millivolts and +150 millivolts at room temperature.

The retrograde pocket region has a relatively low concentration of dopant atoms in the pocket region portion overlapping the channel region. Those of skill in the art will realize that the actual preferred concentrations for a particular embodiment will depend on the channel width of the device being developed and the concentrations discussed below represent some embodiments only. Specifically, the listed concentrations are most appropriate for MOS devices having drawn channel region lengths of about 0.35 μm and gate oxide thicknesses of about 65 Å. It should also be understood that, in general, dopant concentrations in devices should vary inversely with device size; that is, as device sizes decrease, dopant concentration should increase. This is because depletion regions created by p-n junctions adjacent source and drain regions must scale with channel region width to prevent punch through. In other words, as channel region widths decrease, the depletion regions must also decrease so that they do not span the entire channel region and thereby lead to punch through. The size of depletion regions can be limited by increasing the dopant concentrations at the locations where the depletion regions form. Hence, the dopant concentrations should increase with decreasing device sizes.

In one embodiment, the maximum concentration of dopant atoms of the first conductivity type where the channel region/pocket region overlap is at most about $10^{17}$ cm−3, and preferably between about $10^{14}$ and $10^{16}$ cm−3. For comparison, the first conductivity type dopant concentration in the channel region is at most about $1\times10^{16}$ cm−3. Below the channel region, the pocket region dopant concentration should be somewhat higher. Typically, maximum dopant concentration in that region is at least about $10^{16}$ cm −3, and preferably between about $10^{17}$ and $10^{18}$ cm−3. As higher dopant concentrations in the retrograde pocket region reside beneath the channel region, the maximum pocket region dopant concentration should be located at least about 0.02 μm below the top surface of the semiconductor substrate.

In one embodiment, the asymmetric device includes a counter dopant region located in or adjacent to the channel region. The counter dopant region contains counter dopant atoms of the second conductivity type in sufficient concentration that the substrate/channel region locally assumes the second conductivity type. In the area where the pocket and channel regions overlap, however, the substrate retains the first conductivity type. In another embodiment, the counter dopant region is a "buried" counter doped region which resides below the top surface of the semiconductor substrate and in or abutting the channel region. Such a buried counter dopant region has a maximum net dopant concentration of the second conductivity type of at least about $10^{17}$ cm−3 located between about 0.02 and 0.15 μm from the semiconductor substrate's top surface. By burying the counter dopant, the MOS device's conduction path is forced above the region of maximum counter dopant, thereby reducing impurity scattering in the device.

In another aspect, the present invention provides a method of forming a MOS device with a retrograde pocket region. The method may be characterized as including the following steps: (1) forming a bulk region having a first conductivity type; (2) forming a gate over the bulk region, a portion of the bulk region immediately underlying the gate defining a channel region; (3) forming a pocket region of the first conductivity type extending into a portion of the channel region on one side of the channel region; and (4) forming source and drain regions of a second conductivity type separated by the channel region. The pocket region is formed under conditions such that it meets the criteria of a retrograde pocket region described above. To achieve this, the step of forming the pocket region should involve implanting ions at a dose of between about $5\times10^{11}$ and $1\times10^{13}$ cm−2 and at an energy of between about 20 and 120 keV.

In one embodiment, the above method also includes a step of forming a buried counter dopant region of the second conductivity type meeting the above criteria. Thus, the buried counter dopant region may be formed by a step of implanting ions of the second conductivity type in the bulk region. In one embodiment for a NFET device, the pockets should be doped, typically with boron, at about $1-4\times10^{12}$ and an energy of 20–40 kev and the counter dopant, typically phosphorous or arsenic, at a dose of between about $0.5-2\times 10^{12}$ and at an energy of between about 100 and 200 keV For a PFET device, the pockets should be doped, typically with phosphorous or arsenic, at a dose of between about $0.5-2\times 10^{12}$ and at an energy of between about 100 and 200 keV and the counter dopant, typically with boron, at about $1-4\times10^{12}$ and an energy of 20–40 keV.

In yet another aspect, the present invention provides a method of forming a MOS device with retrograde pocket regions and counter dopant regions buried in the substrate surface that may be characterized as including the following steps: (1) forming a bulk region having a first conductivity type and having a bulk region dopant concentration; (2) implanting a counter dopant of a second conductivity type at the surface of the substrate; (3) growing an epitaxial layer on the top surface of the semiconductor substrate; (4) forming a gate over the epitaxial layer, a portion of the epitaxial layer immediately underlying the gate defining a channel region; (5) forming a pocket region of the first conductivity type extending into a portion of the bulk region, the pocket region having a dopant concentration that is greater than the bulk region dopant concentration and the epitaxial layer; (6) forming source and drain regions of a second conductivity type separated by the channel region. In an embodiment with a 0.35 micrometer channel, the epitaxial layer should have a thickness of between about 50 and 200 angstroms.

These and other features and advantages of the present invention will become apparent to those skilled in the art upon reading the following description and studying the associated figures.

DETAILED DESCRIPTION OF THE INVENTION

The Structure of Retrograde Pocket Mos Devices

In the following description of the invention, certain dopant concentrations in MOS devices are specified. It should be understood that these concentrations represent some embodiments only. Specifically, the listed concentrations are most appropriate for MOS devices having drawn channel region lengths of about 0.35 μm and gate oxide thicknesses of about 65 Å. It should also be understood that, in general, dopant concentrations in devices should vary inversely with device size; that is, as device sizes decrease, dopant concentration should increase. This is because depletion regions created by p-n junctions adjacent source and drain regions must scale with channel region width to prevent punch through. In other words, as channel region widths decrease, the depletion regions must also decrease so that they do not span the entire channel region and thereby lead to punch through. The size of depletion regions can be limited by increasing the dopant concentrations at the locations where the depletion regions form. Hence, the dopant concentrations should increase with decreasing device sizes.

As this invention is not limited to 0.35 μm technology, the concentrations set forth below should not be considered to limit the invention. Therefore, it should be expected that preferred dopant concentrations recited herein may be increased as necessary to reduce depletion region sizes in smaller devices (less than about 0.35 μm devices), and may likewise be decreased as appropriate in longer channel devices.

Throughout this specification, the term "channel region" will be used frequently. That term, as used herein, refers to the entire electrically active region between the source and drain, not just the inversion layer formed when the gate voltage exceeds the threshold voltage.

Figure 1:
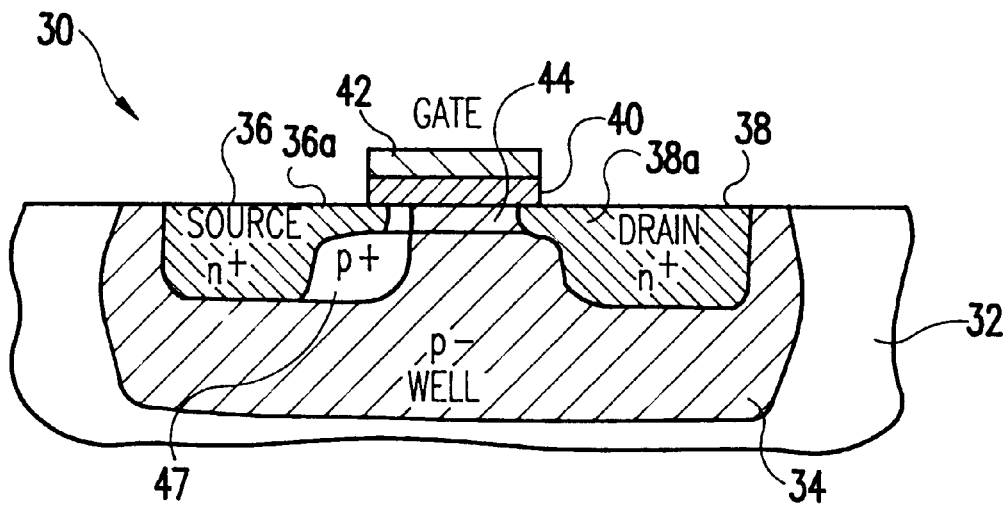
FIG. 1 is a side sectional view of a NMOS transistor having a retrograde pocket region in accordance with one embodiment of the present invention.

Turning now to FIG. 1, a side sectional view of an asymmetric MOS device 30 having a p+ pocket region 47 is shown. Device 30 includes a lightly doped p-type well region 34 extending downward from the surface of a semiconductor substrate 32 into its bulk. Preferably, this well region, excluding the source, drain, and pocket regions described subsequently, has an average dopant concentration of between about $1\times10^{14}$ and $5\times10^{16}$ cm−3. Provided within well region 34 are (1) a heavily doped n-type source region 36 with an associated "tip" 36A, and (2) a corresponding heavily doped drain region 38 with an associated tip 38A. Preferably, the dopant concentrations of the source region 36 and the drain region 38 are each in the range of between about $1\times10^{20}$ and $1\times10^{22}$ cm −3, and the dopant concentrations of the tips are in the range of between about $1\times10^{19}$ and $1\times10^{21}$ cm−3. In some embodiments, the source and drain (or one of the two) will be shaped such that they do not have tips; rather they will include only plug portions which extend up to the channel region.

The specific transistor 30 shown in FIG. 1 is an NFET; i.e., it has an n-type source, an n-type drain, and a p-type well. Although not illustrated, transistor 30 could also be a PFET transistor having a p-type source, a p-type drain, and an n-type well. In that case, the dopant concentrations specified herein for NFETs would apply with equal validity, only the dopant conductivity types would be reversed. It should also be noted that in some embodiments, the bulk semiconductor 32 may be provided with a sufficiently high p-type dopant concentration (in the case of an NFET) that no well region is required. In such cases, the source and drain regions can be formed directly in the bulk. Of course, if both p-type and n-type devices are formed on the same semiconductor substrate 32, the p-type devices will have to be formed in lightly doped n-type wells, assuming that the substrate is lightly doped with p-type dopants.

A channel region 44 is provided in the device 30 between the source and drain tip regions 36A and 38A. As noted, the dopant concentrations presented herein are most appropriate for devices having drawn channel lengths of about 0.35 μm. However, it should be borne in mind that many advantages of the asymmetric structure of this invention also apply to longer channel devices, so long as the supply voltage is maintained at a relatively low level. Given the dopant concentration ranges recited herein, the devices of the present invention typically have drawn channel lengths of about 2 μm or less (i.e., the inner boundaries of the device's source and drain tips should be no more than about 2 μm apart), and preferably in the range of about 0.5 μm or less.

The dopant concentration in channel region 44 directly affects the threshold voltage of the MOS device. As noted, this invention is directed to devices having unconventionally low threshold voltages, so control of the channel region dopant concentration is quite important. Generally, as the p-type dopant concentration decreases in the channel region, the threshold voltage also decreases. Thus, it is generally desirable in the context of this invention to provide a rather low p-type dopant concentration in channel region 44. Outside of pocket region 47, channel region 44 should have an average p-type dopant concentration of less than about $1 \times 10^{16}$ cm−3, preferably between about $1 \times 10^{14}$ and $1 \times 10^{16}$ cm−3, and more preferably about $1 \times 10^{15}$ cm−3. Such low channel region doping concentrations allow the device threshold voltage to be set at or near zero volts.

Even lower threshold voltages can be achieved by counter doping. In some embodiments, the channel region is counter doped with an n-type dopant to achieve very low threshold voltages. Typically, the average counter dopant concentrations are in the range of about $10^{16}$ to $10^{18}$ cm−3. Thus, except for the portion overlapping the pocket region, the channel region will have a net n-type dopant concentration. The counter dopant region should be structured such that the depletion region emanating from the counter dopant-substrate interface (located below the channel region) does not extend to the silicon-oxide interface (substrate surface); otherwise the drain FET will act as a resistor and a substantial potential drop will occur across it. Thus, the counter dopant region should be thick enough, with a high enough concentration, to avoid becoming fully depleted.

Returning to FIG. 1, a gate dielectric layer 40 is provided on the surface of the p-type well 34 and overlying the channel region 44. In some embodiments, gate dielectric layer 40 is a thin layer of silicon dioxide about 65 Å thick (for 0.35 μm devices). A polysilicon gate electrode layer 42 is provided on the oxide layer 40 as shown. In general, either an n-type or p-type gate layer may provided on either NFETs or PFETs of this invention. However, in a NFET surface channel device of this invention, the gate electrode is doped n-type.

Pocket region (sometimes referred to as an "asymmetric halo" region) 47 is provided in well 34 underlying the source tip region 36A and extending slightly into and under a portion of the channel region 44. The pocket region 47 has the same conductivity type as the well region 34, but with a somewhat higher dopant concentration. Typically, its average dopant concentration is between 10 and 1000 times greater than the dopant concentration in the well. Pocket region 47 serves to provide its portion of the channel region with a somewhat higher threshold voltage than the remainder of the channel region.

In accordance with this invention, the pocket region has a "retrograde" concentration profile in which the dopant atom concentration increases from the substrate surface downward into the substrate bulk until it reaches a concentration maximum. From there, the concentration decreases with depth until the bottom of the pocket region is reached. Within the channel region, the retrograde pocket should have a maximum concentration of dopant atoms of at most about $10^{17}$ cm−3, and more preferably between about $10^{14}$ and $10^{16}$ cm−3. Below the channel region, the retrograde pocket should have a maximum concentration of dopant atoms of at least about $10^{16}$ cm−3 and more preferably between about $10^{17}$ and $10^{18}$ cm−3. That maximum concentration should lie at least about 0.02 μm below the top surface of the semiconductor substrate. By centering the highest concentration of pocket region dopant atoms below the channel region, the mobile charge carriers experience less mobility degradation due to impurity scattering. Hence the device series resistance is reduced (in comparison to prior asymmetric devices) and performance is improved.

In this invention, the pocket region is provided on only one side of the device: i.e. on either the source side or the drain side. Thus as shown in FIG. 1, no pocket region appears under the drain tip 38A. Of course, the present invention does not foreclose the possibility that some small regions of relatively high p-type dopant concentration will be found proximate the drain region (e.g., to prevent punch through, enhance tunability, or reduce well resistance). However, to ensure that the device switches on in two stages as described above, any such local variations should be limited in size and/or dopant concentration.

It should be noted that the pocket region may be provided under either the source or drain tip region. For consistency, however, the asymmetric halo device will be described herein as having a pocket region under the source region.

In the embodiment shown in FIG. 1, the pocket region 47 extends only very slightly into the channel region 44. This is in keeping with a design objective that the short channel pseudo-device (a source FET in the case of FIG. 1) has an extremely short effective channel length. Typically, the pocket region 47 extends no more than 0.1 μm into the channel region 44, and preferably no more than about 500 Å into the channel region. In the alternative embodiments, not shown, the pocket region is limited to regions outside of the channel region.

Contacts or ties (not shown) are provided for the source, drain, gate, and bulk (well) regions respectively. Such contacts connect these elements to conductive lines patterned on one or more metallization layers disposed above the MOS device 30. These various ties are electrically isolated from one another and from the device's gate by an oxide, glass, or other insulating layer (sometimes referred to as a passivation layer). The ties are typically formed of tungsten, aluminum, aluminum/copper alloy, etc. They may be separated from the underlying semiconductor substrate (or gate polysilicon) by a layer of titanium and a layer of titanium nitride to prevent metal species from migrating into the semiconductor and thereby degrading performance.

Figure 2:
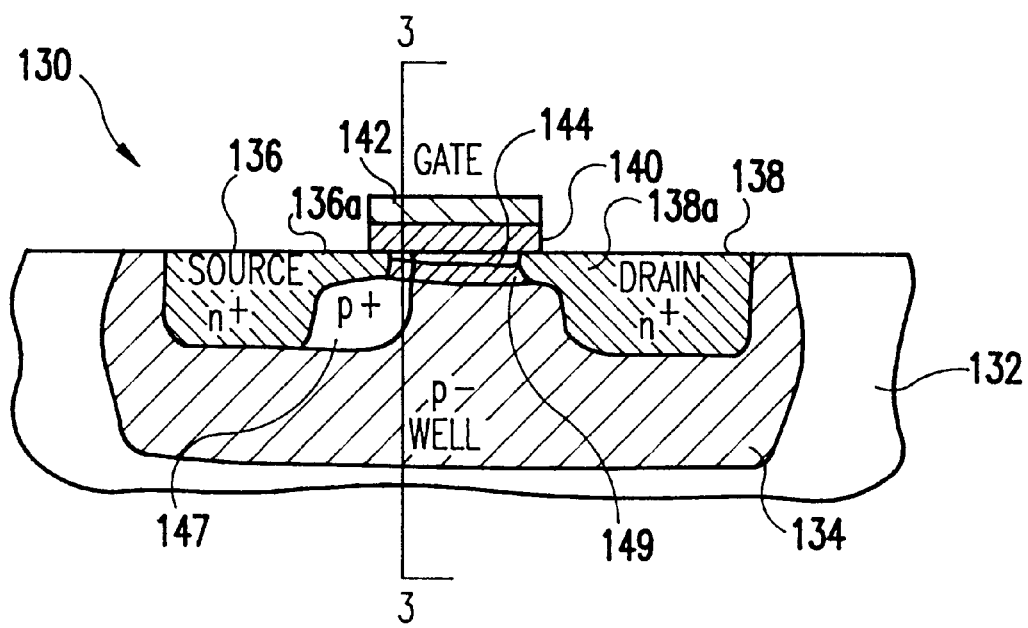
FIG. 2 is a side sectional view of a NMOS transistor similar to that shown in FIG. 1, but having a buried counter dopant region.

FIG. 2 is a side sectional view of a second embodiment of the present invention in which an asymmetric NMOS transistor 130 is provided with a "buried" counter dopant region 149. In many regards the device of FIG. 2 resembles the device of FIG. 1. Thus, for example, the transistor 130 includes a lightly doped well region 134 extending downward from the surface of a semiconductor substrate 132 into its bulk. Typically, the well region, excluding the source, drain, counter dopant and pocket regions (described below), has an average dopant concentration as described with reference to FIG. 1. Further, a heavily doped n-type source region 136 with an associated "tip" 136A and a corresponding heavily doped drain region 138 with an associated tip 138A are provided in well region 134 and have properties similar to those described with reference to FIG. 1. In addition, a retrograde pocket region 147 is provided in well 134 underlying the source tip region 136A as in the embodiment of FIG. 1.

A channel region 144 extends between the source and drain tip regions 136A and 138A. A gate oxide layer 140 is provided on the surface of the p-type well 134 and an n-type gate electrode layer 142 is provided on the oxide layer 140 as shown and described with reference to FIG. 1.

The buried counter dopant region 149 of elevated n-type dopant concentration is provided in well region 134 below the surface of semiconductor substrate 132 at or near the bottom of channel region 144. As shown, the buried counter dopant region 149 extends from the source tip 136A to the drain tip 138A, and overlaps pocket region 147 near the source. Preferably, the peak dopant concentration in the buried counter dopant region is positioned below the semiconductor surface at a distance between about 0.05 and 0.2 $\mu$m and more preferably between about 0.08 and 0.15 $\mu$m. Further, the dopant concentration in the buried counter dopant region preferably has a maximum net n-type dopant concentration of at least about $10^{16}$ cm-3 and more preferably between about $10^{17}$ and $10^{18}$ cm-3. At these concentrations, an excess of n-type dopant atoms reside in the buried counter dopant region, giving this region a net n-type conductivity (except where it overlaps pocket region 147).

The location and dopant concentration profile of buried counter dopant region 149 should be provided such that a conductive path having a vertical component of electric field equal to zero is produced within channel region 144 and above buried counter dopant region 149 while MOS device 130 is switched on. To this end, the buried counter dopant region will be in or abutting channel region 144, but not extending to the surface of the semiconductor substrate. In this manner, charge carriers are directed along a path having a relatively low concentration of dopant atoms, and hence a relatively high conductivity.

Figure 3:
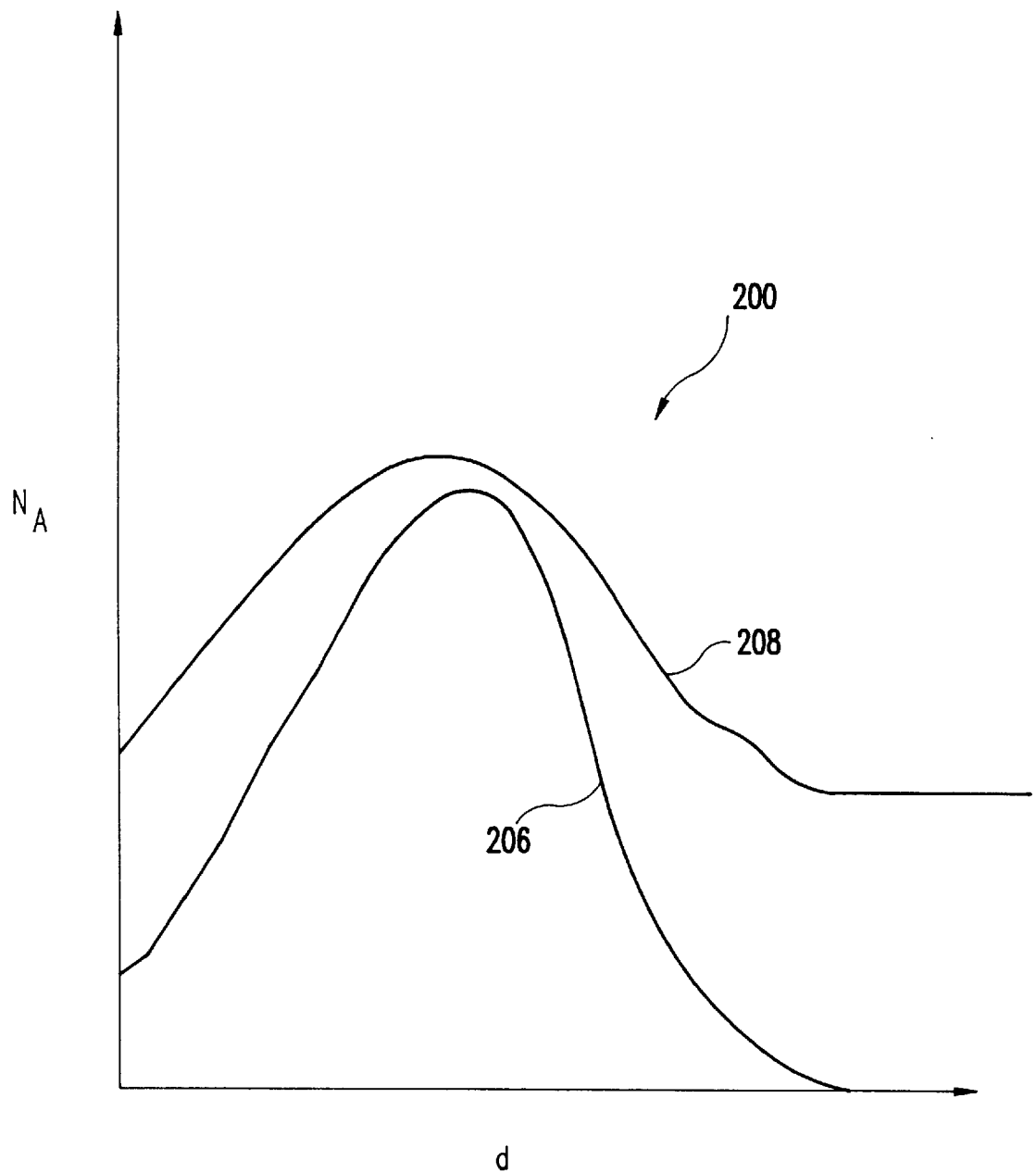
FIG. 3 is a graph illustrating the vertical dopant concentration profile through the pocket region of the NMOS transistor shown in FIG. 2.

FIG. 3 depicts the concentration profiles of n and p-type dopants in a cross-section 3—3 of MOS device 130. As shown, the vertical axis (NA) represents the dopant concentration and the horizontal axis (d) represents distance from the semiconductor substrate surface (i.e., the interface of the substrate and the gate oxide). The intersection of the vertical and horizontal axes represents a dopant concentration of zero and a position at the substrate surface. Curve 206 depicts the counter dopant concentration while curve 208 depicts the pocket region concentration. As shown, the counter dopant concentration 206 peaks well below the substrate surface, as expected for buried counter dopant regions. At some distance below the substrate surface, the counter dopant concentration goes to zero. The retrograde pocket concentration 208 also peaks well below the substrate surface (outside of the channel region) and then tails off to a constant value some distance further below the surface. As the bulk substrate (or well region) is p-type in this example, curve 208 remains non-zero (at least to the edge of the well region).

As shown, the pocket region concentration 208 remains greater than the counter dopant concentration 206 throughout the entire cross-section 3—3. This ensures that there will always be an n-p-n net conductivity profile from source to pocket region/channel region to drain.

Low Threshold Voltage Devices

Low threshold devices (such as those typically for use with this invention) generally have relatively large leakage currents. In the past, when memory logic was the primary focus of integrated circuit design, engineers designed devices to have relatively high threshold voltages and hence very small leakage currents. Such traditional devices are still designed to have a ratio of "on current" to "off current" (a measure of leakage current) of at least about $10^6$ and typically in the range of $10^7$ to $10^8$. While such high ratios may be appropriate for relatively inactive circuits such as RAM cells, in more active circuits typically used in microprocessors, the threshold voltage can be substantially lowered. The present invention is primarily concerned with such active devices. Therefore, the devices of the present invention will typically be characterized by a ratio of on current to off current of at most about $10^5$, and more typically about $10^2$–$10^3$. For some highly active devices, the ratio may even be as low as 10. In terms of absolute threshold voltage, the MOS devices of this invention will typically have a threshold voltage of between about −150 and +150 millivolts. However, this range is not critical to the practice of the invention. Of course, some method should be employed to control leakage while the normally active circuits of this invention are in sleep or standby mode.

Asymmetric Devices Having Channel Regions With Two Different Threshold Voltages

While not wishing to be bound by theory, it is believed that the asymmetric devices of this invention should provide significantly improved performance over other low threshold voltage devices because, at appropriate gate voltages, their behavior is governed by charge carrier transport across a very short effective channel length (on the order of a few hundred angstroms to 0.1 micrometers). Specifically, the devices are engineered so that the pocket region under the source or drain creates a short channel pseudo-FET. It is believed that such asymmetric devices behave like two pseudo-MOS devices in series: a "short channel FET" and a "longer channel FET." Depending upon how the device is designed, one of these will be a "source FET" and the other will be a "drain FET."

Figure 4:
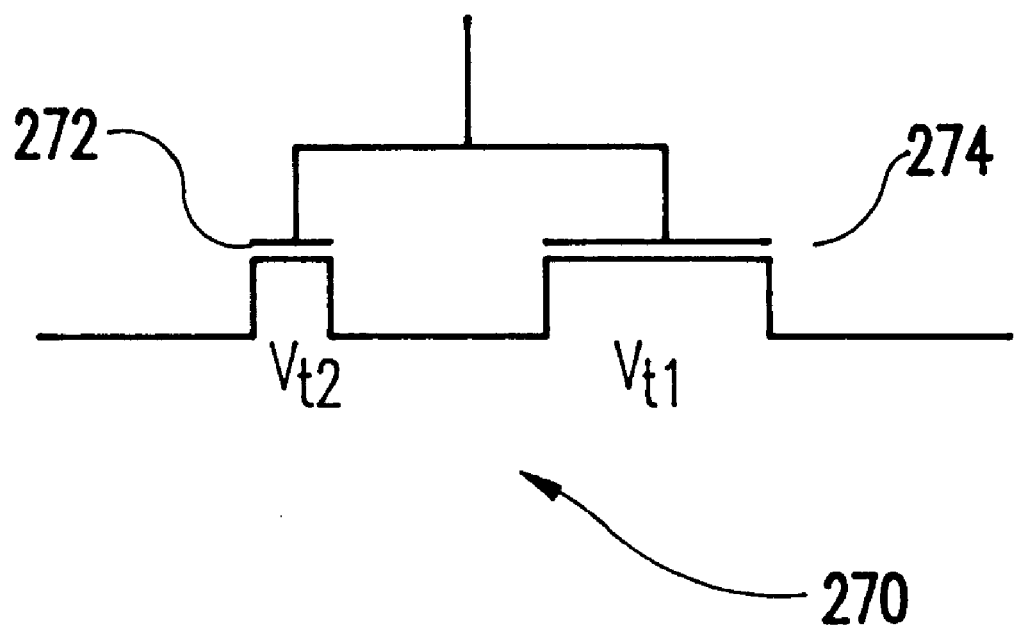
FIG. 4 is a schematic illustration of a MOS transistor of this invention acting as two pseudo-devices in series: a short channel pseudo-FET and a longer channel pseudo-FET.

The pocket region next to the source (as shown in FIGS. 1 and 2) introduces a local variation in the vertical field in a portion of the channel region near the source. This in turn causes a local increase in the threshold voltage so that the device switches on in two stages. As shown in FIG. 4, an asymmetric device 270 having such a pocket region acts as a short channel pseudo-FET 272 (source FET) having a relatively high threshold voltage Vt2 connected in series with a longer channel pseudo-FET 274 (drain FET) having a lower threshold voltage Vt1. At gate voltages between Vt1 and Vt2, pseudo-FET 274 has switched on, but pseudo-FET 272 remains off.

As explained above, very short channel devices have the potential for greatly improved performance due to ballistic electron transport (i.e., transport without scattering). However, to realize such improved performance, the asymmetric MOS device should be operated such that its performance is dictated by the short channel pseudo-FET (and hence these short channel effects), and not by longer channel effects (as it would be if the overall MOS structure dictated performance). This can be accomplished by switching such asymmetric device at gate voltages just slightly greater than the threshold voltage of the short channel pseudo-FET, which should be near 0 volts.

In operation, the normal "off" gate voltage surpasses the threshold voltage of the longer channel drain FET, so that this pseudo-FET is always on. However, this gate voltage does not surpass the short channel source FET. In this gate voltage domain, between the threshold voltages of the drain FET and the source FET, an inversion layer forms extending from the drain-channel junction across the channel region to the edge of the source FET. Because no current is flowing, the inversion layer in the channel region acts as an extension of the drain, held at the same potential as the drain. In essence, the relatively large asymmetric MOS device has been converted to an extremely small source FET device (in the gate voltage domain between the threshold voltages of the drain FET and the source FET). Now, when the gate voltage exceeds the threshold voltage of the source FET, an abrupt potential drop occurs across the source FET channel as current flows.

In view of the above discussion, it should be apparent that asymmetric devices should be engineered such that the channel length of the source FET pseudo-device is made as small as possible (consistent with leakage constraints and avalanche breakdown mechanisms). The various factors that come into play in controlling the source FET channel length include (1) the dopant distribution in the tip of the source, (2) the dopant concentration gradient at the side of the pocket adjacent the channel region, (3) the dopant concentration gradient of the source body adjacent the pocket, and (4) the distance that the pocket extends into or underneath the channel region. By controlling these variables, it is believed that the source FET channel can be made smaller than 0.1 micrometers and preferably in the range of 200 to 500 angstroms. In general, good results should be expected by providing a very steep dopant concentration gradient at the boundary of the pocket and the bulk (well) regions. Preferably the dopant concentration will drop by as much as 3 orders of magnitude over about 3 nanometers between the pocket region and the bulk region. (Such steep gradients have been described in a paper by Sai-Halasz et al., "High Transconductance and Velocity Overshoot in NMOS Devices at the 0. 1-$\mu$m Gate-Length Level," IEEE Electron Device Letters, Vol. 9, No. 9, pp. 463–465 (1988) which is incorporated herein by reference for all purposes.) Similarly, the dopant concentration gradients at the source tip-channel region boundary and at the source body-pocket boundary should be comparably steep. Still further, a thin tip region (with a pocket region lying immediately underneath) will generally improve performance by reducing punch through effects. Of course, if the tip region becomes too thin, the source resistance will be too high.

Back Biasing

By providing light doping and/or counter doping in the channel region of a device, the device's threshold voltage will be near zero. Due to processing variations, the exact dopant concentration in the channel region can vary slightly from device to device. Although these variations may be slight, they can shift a device's threshold voltage by a few tens or even hundreds of millivolts (to outside of the preferred range for operation of this invention). Further, environmental factors such as operating temperature fluctuations can shift the threshold voltage. Still further, low threshold devices may leak too much when their circuits are in sleep or standby mode. Thus, it is desirable to provide a mechanism for tuning the threshold voltage in low threshold voltage devices such as those of this invention. This can be accomplished by using back biasing, i.e. controlling the potential between a device's well and source. See James B. Burr, "Stanford Ultra Low Power CMOS," Symposium Record, Hot Chips V, pp. 7.4.1–7.4.12, Stanford, Calif. 1993 which is incorporated herein by reference for all purposes.

Back biasing is accomplished by controlling the potential difference between the source and well regions of the transistor. Typically, the potential will be controlled through isolated ohmic contacts to the source and the well regions together with the circuitry necessary for independently controlling the potential of these two regions. As the potential difference is increased, the magnitude of the threshold voltage increases. In general, a relatively large back bias voltage is required to adjust the threshold voltage a comparatively small amount. In some embodiments, the device will be engineered such that a shift in threshold voltage of about 100 millivolts is accomplished with about 1 volt of back bias.

Back biasing can be implemented using various automatic techniques. In one such method, a feedback amplifier adjusts the bias voltage of a well so that the drain current of a test device in the well matches a reference current. A tuning circuit can be designed to match the off current (in the range of 1 nanoamp to 1 microamp), or the on current (in the range of 100 microamp/micrometer), or some function of both the on and off currents. Such circuits can sample the current from several test devices to obtain average on and off currents. The power dissipation of one of these well-tuning circuits is typically quite small, on the order of 1 microwatt, and its area is also small, typically about 100 square micrometers, so that hundreds or even thousands of such circuits can be distributed throughout an integrated circuit chip without significantly impacting area or power, while substantially improving low voltage performance by providing tightly controlled operating environments over small, local transistor populations.

In asymmetric MOS devices, back biasing can be accomplished by controlling the potential of the MOS device's pocket region, as opposed to merely controlling the potential of the device's well region or bulk. This allows for fine tuning of the potential (and thus threshold voltage) at the short channel pseudo-FET. A further discussion of back biasing by controlling the pocket region's potential is provided in U.S. patent application Ser. No. 08/543,485 (Attorney Docket No. SUN1P041/P866), filed Oct. 16, 1995, naming Burr and Laird as inventors, and entitled BACK-BIASING IN ASYMMETRIC MOS DEVICES. That application is incorporated herein by reference in its entirety for all purposes.

Process of Fabricating Low Threshold Devices Having a Retrograde Pocket Region

A. Process I

FIGS. 5A–I illustrate some of the steps employed in fabricating an asymmetric MOS device with a retrograde pocket region and a buried counter dopant region in accordance with the present invention. It should be understood that numerous variations of this process are permissible and within the scope of this invention. Further, although this process is described as a sequence of steps for forming an NFET, the process could be applied equally to a PFET if the conductivity types of the dopants employed in the various steps is reversed. Still further, it should be understood that the conditions recited herein are appropriate for devices in the neighborhood of 0.35 µm. The process conditions may have to be modified somewhat for devices in other size regimes.

Figure 5A:
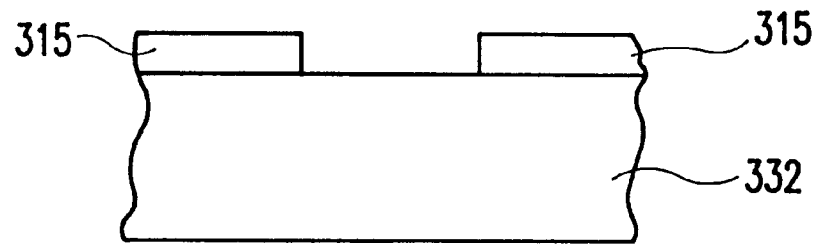
FIGS. 5A–5I are side sectional views of a partially completed transistor at various stages of fabrication in accordance with a method of the present invention.

In FIG. 5A, a substrate 332 of monocrystalline silicon or other suitable semiconductor material is provided with an ion implant mask 315 of suitable masking material which exposes a selected portion (the "p-well portion") of substrate 332.

Figure 5B:
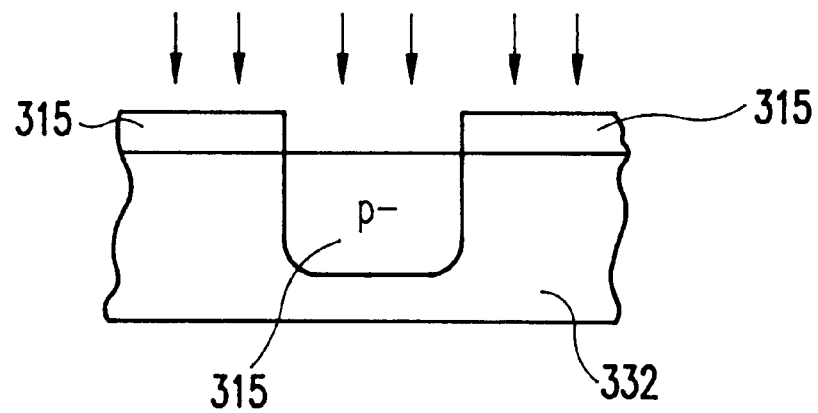

In FIG. 5B, a p-type ion implant is performed over the substrate, penetrating the unmasked portion of the substrate 332 (the "p-well portion"). The p-type dopant is provided at a dose and energy sufficient to produce a very lightly doped well region 334. A subsequent diffusion anneal is conducted at a temperature and for a time sufficient to smooth out the p-type dopant concentration over well region 334 to give a relatively uniform overall very light p-doping level.

In alternative embodiments, it may be desirable to form a "retrograde well" to prevent punch through. Such wells have a higher dopant concentration near the bottom of the well, away from the channel region. Either way, the well formation conditions should be chosen such that the p-well region has a p-type dopant concentration at the substrate surface (i.e., the channel region) of between about $1 \times 10^{14}$ and $1 \times 10^{16}$ atoms/cm3 (as discussed above).

It should be noted that in some systems, the single crystal silicon substrate 332 is grown with a specific p-type dopant concentration in this range. In other embodiments, a layer of silicon of the desired bulk concentration is grown epitaxially on top of a heavily doped substrate. In such cases, there will be no need to perform the above steps of forming a p-well.

Figure 5C:
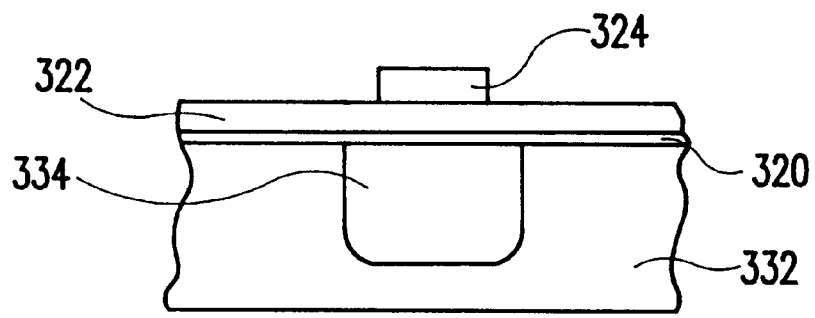

To obtain the structure shown in FIG. 5C, the mask 315 is removed and a pad oxide 320 (silicon dioxide) covering the substrate 332 is grown to a thickness of between about 30 and 80 nanometers at a temperature in the range of about 700 to 1000C. Next, a layer of silicon nitride 322 is deposited, typically by low pressure chemical vapor deposition (LPCVD), to a thickness of between about 0.1 and 0.2 micrometers on pad oxide 320. Thereafter, a resist mask 324 is provided to protect the active areas (i.e., regions where active transistors are to be formed).

Figure 5D:
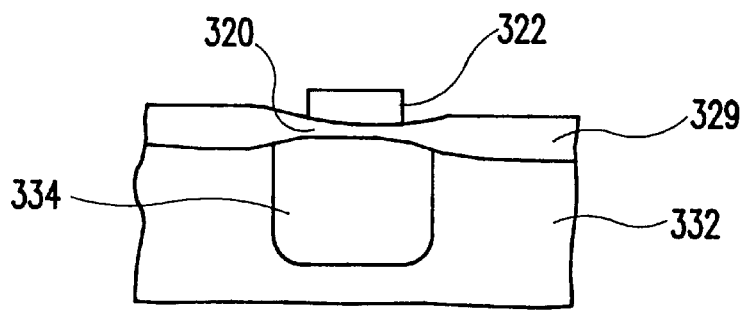

The structure shown in FIG. 5D is then prepared as follows. A dry etch (typically a reactive ion etch or RIE) is performed on the exposed nitride and oxide layers to produce a bare silicon surface in these regions. Next, the resist mask 324 is removed and a thick field oxide 329 (silicon dioxide) is grown at a temperature of between about 700 and 1000C to a thickness between about 0.2 and 0.5 micrometers to produce the structure shown 1n FIG. 5D. Thereafter, this structure is selectively etched to remove nitride layer 322, typically by a wet etch with ortho-phosphoric acid. Then pad oxide 320 is removed by a timed wet etch to expose the silicon substrate in the active device regions. This produces a structure, which is further processed as shown in FIG. 5E.

The field oxide 329 serves to electrically isolate the various devices on a chip. It should be understood that other device isolation techniques could also be employed. For example, in an alternative embodiment, trenches filled with dielectric material such as borophosphosilicate glass could be used in place of the field oxide to isolate devices on the chip. Processes for forming trench isolation regions are known in the art.

Figure 5E:
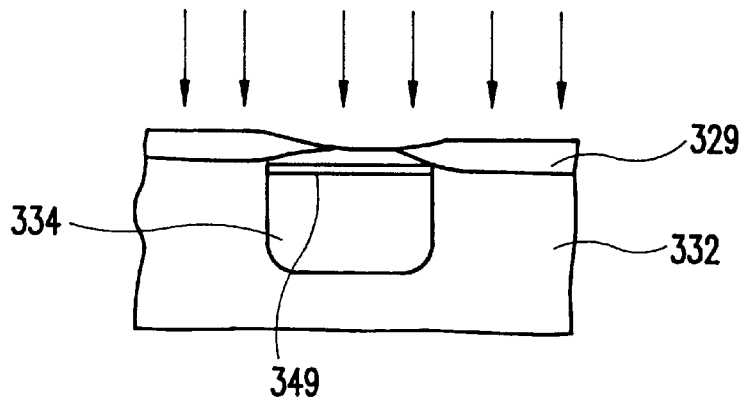
Figure 5F:
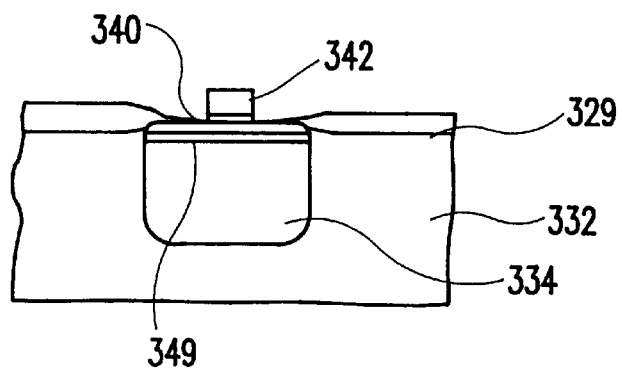

The step depicted in FIG. 5E is a counter dopant implant performed at an energy and dosage sufficient to produce a counter dopant region 349 of n-type dopant reasonably near, but not contacting the surface of substrate 332. This implant is performed under conditions suitable for forming a counter doped region of between about $10^{16}$ to $10^{18}$ cm−3. For example, the counter dopant implant might be performed with phosphorous implanted at a dose of about $5 \times 10^{11}$ to $1 \times 10^{13}$ cm−2, and at an energy of between about 20 and 200 keV A subsequent diffusion anneal may be conducted at a temperature and for a time sufficient to spread out the n-type dopant concentration profile.

After the counter dopant region has been formed, a gate oxide 340 is grown on the silicon surface at a temperature of between about 800 and 950C to a thickness of between about 3 and 15 nanometers. After the gate oxide has been formed, a gate electrode layer 342 of polysilicon is deposited over the surface to a thickness of between about 100 and 300 nanometers. On this layer, a resist mask is defined to protect the transistor gate region. Then, the exposed polysilicon is selectively etched and the resist mask is removed to provide the structure shown FIG. 5F.

As described, the gate dielectric is a single layer of silicon dioxide. However, in alternative embodiments, it may also be a multi-layer structure including silicon nitride.

Figure 5G:
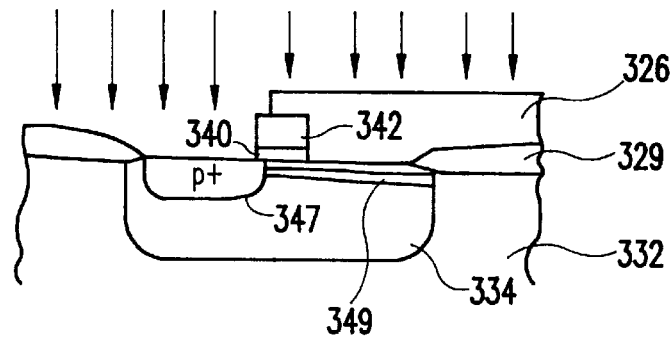

A mask 326 is now formed on the substrate from the polysilicon layer 342 along the right side (a drain side) of the partially fabricated MOS device as shown in FIG. 5G. Next, a p-type halo implant is conducted at an energy and dosage sufficient to form a retrograde pocket region 347 having a concentration profile as described above. For example, the pocket region might be formed with boron implanted at about $5 \times 10^{11}$ to $1 \times 10^{13}$ cm−2 at an energy of between about 20 and 120 keV Typically, the implant will be performed under conditions which cause the pocket region 347 to extend slightly under the gate oxide 340 as shown. For example, implant might be conducted at an angle. In some embodiments, indium may be an appropriate pocket dopant because this element has a relatively small diffusion coefficient and therefore is likely to form pockets having rather steep concentration profiles. In the case of a PFET, antimony may be used because it too has relatively small diffusion coefficient.

Figure 5H:
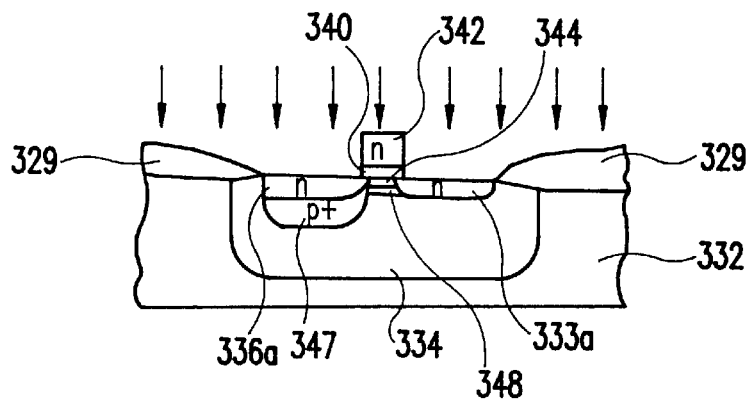

After forming pocket region 347, mask 326 is removed. Then as shown in FIG. 5H, an n-type ion implant is conducted at an ion dose of about $10^{13}$–$10^{14}$ cm−2 and an ion kinetic energy of between about 20 and 60 keV with ions drawn from P, As, Sb, or Sn. This implant is performed over the entire substrate, penetrating the p-well portion of the apparatus to form two n doped layers 336A and 338B flanking a p-type channel region 344 to the left and right, respectively, within the p-well 334. This implant is intended to form a device's source and drain "tip" regions which extend to the edge of the channel region. As shown, a p-type pocket region 347 partially remains below the source tip region 336A. In some embodiments, the junctions between these tip regions and the adjacent channel region have steep dopant concentration gradients. Thus, subsequent processing should be conducted under conditions which minimize dopant diffusion in these tip regions. To the extent possible, this will generally require conducting subsequent heating steps at relatively low temperatures and for relatively short times, or by using rapid thermal annealing ("RTA") as is known to those of skill in the art.

Figure 5I:
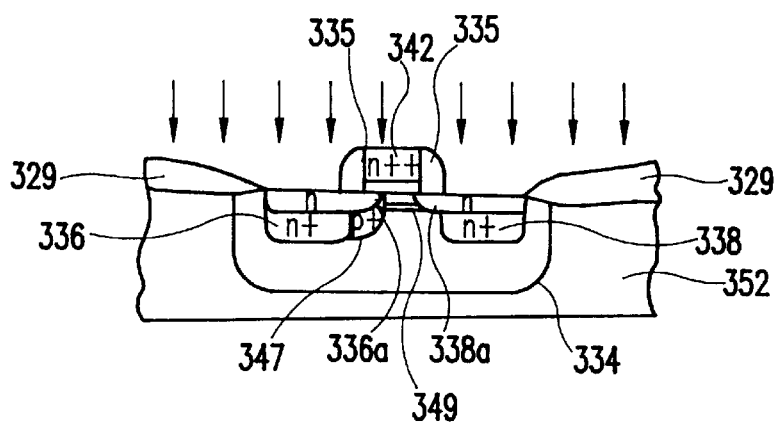

Next, "plug" regions 336 and 338 of the source and drain as shown in FIG. 5I are formed as follows. Initially, a blanket oxide insulating layer is deposited over the device. Most of this layer is then anisotropically etched away, leaving side wall insulating spacers 335 of width 0.05–0.3 µm, flanking the polysilicon gate 342 on the right and left as shown in FIG. 5I. Thereafter, an n-type ion implant (ion dose=$1\times10^{15}$–$5\times10^{15}$ cm−2; ion kinetic energy=50–100 keV; ions drawn from P, As, Sb, or Sn) is performed over the substrate, penetrating the p-well portion of the structure. This produces drain and source plugs 336 and 338 of increased n-type doping. After drain and source layers 336 and 338 have been formed, an anneal step is performed. As can be seen in FIG. 5I, after the plug regions of the source and drain are formed, an asymmetric pocket region 347 remains partially under and partially adjacent source tip 336A and the channel region.

In some embodiments, only a single anneal step is conducted for the pocket, tip, and plug implants. Preferably, it is conducted after all of these steps are completed. In other words, no anneal step is performed immediately after the asymmetric pocket and tip implants. This limited annealing allows the pocket and tip regions to maintain relatively steep concentration gradients near the channel region.

After the source and drain regions have been implanted and annealed as desired, an insulating layer is formed over the device, and apertures or vias are selectively etched and filled with metal, such as aluminum, tungsten, titanium or other electrically conductive material to provide electrical contacts for the various device elements.

Various techniques are available for forming the electrical contacts/ties. In one approach, after the apertures/vias have been formed, a titanium (Ti) layer is conformally deposited over the structure. Thereafter, a titanium nitride (TiN) layer is conformally deposited over the Ti layer. Next, the MOS device is subjected to a rapid thermal anneal (RTA) step to cause some Ti from the Ti layer to diffuse into the source, drain, gate, and pocket regions and form titanium silicide ohmic contacts.

Following the RTA, a blanket layer of tungsten (W) is deposited over the partially fabricated chip at a temperature of typically about 450C followed by an etchback process removing all the blanket W layer except a plug in the aperture. Next, a second TiN barrier layer is deposited over the tungsten filled vias. At this point, the upper surface of the structure is relatively flat and contains no unfilled vias. On this surface, an aluminum metallization layer is now deposited, overlying the second barrier layer. This layer is subsequently patterned to connect the vertical ties with horizontal conductive lines such as those that control the potential of the pocket region 347.

B. Process II

Figure 6E:
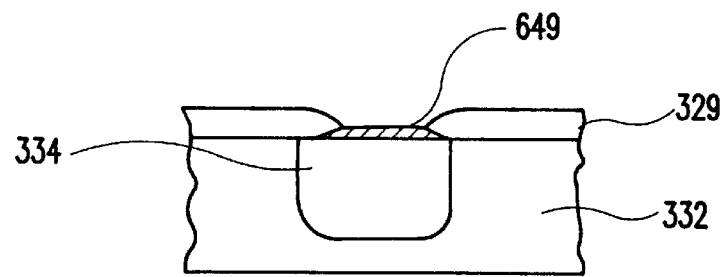
FIGS. 6E–6K are side sectional views of a partially completed transistor at various stages of fabrication in accordance with a second method of the present invention.

In an alternative embodiment, the channel region is formed as an epitaxial silicon layer. This alternative process is identical in most regards to the process outlined above. In the alternative process, the steps illustrated in FIGS. 5A through 5D are performed as described above. Thereafter, the counter dopant implant is performed under conditions that form a counter dopant region at the surface of the substrate, rather than at a "buried" location below the surface. Thus, the counter dopant implant steps described above with reference to FIG. 5E should be modified so that the implant is conducted with less energy. Such conditions might be, for example, a phosphorous implant at a dose of about $5\times10^{11}$ to $1\times10^{13}$ cm−2, and at an energy of between about 50 and 100 keV. The step depicted in FIG. 6E is a counter dopant implant performed at an energy and dosage sufficient to produce a counter dopant region 649 of n-type dopant at the surface of substrate 332. This implant is performed under conditions suitable for forming a counter doped region of between about $10^{16}$ to $10^{18}$ cm−3. For example, the counter dopant implant might be performed with phosphorous implanted at a dose of about $5\times10^{11}$ to $1\times10^{13}$ cm−2, and at an energy of between about 20 and 200 keV. A subsequent diffusion anneal may be conducted at a temperature and for a time sufficient to spread out the n-type dopant concentration profile.

Figure 6F:
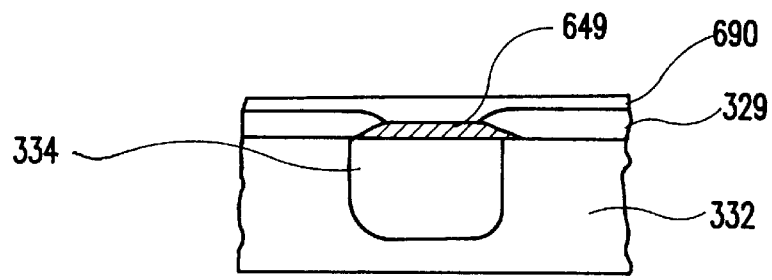

Next, as shown in FIG. 6F, a layer of silicon 690 is grown epitaxially to a thickness between about 50 and 200 Å. Epitaxial silicon layer 690 should have a relatively low dopant concentration, preferably less than about $1\times10^{16}$ cm−3. Epitaxial layer 690 serves as a channel region having a very low dopant concentration and low levels of impurity scattering.

Figure 6G:
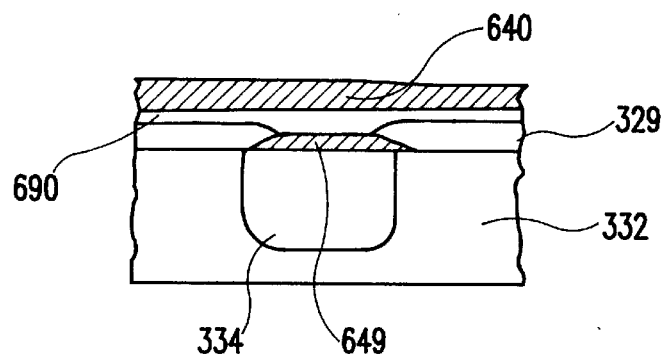
Figure 6H:
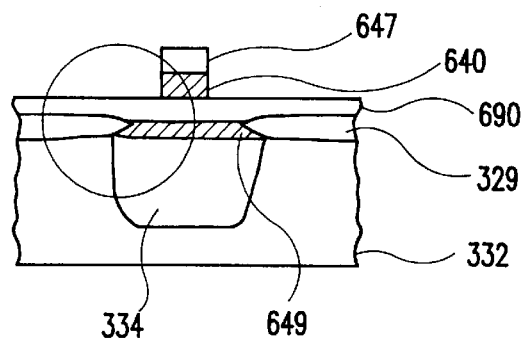

Referring to FIG. 6G, a gate oxide layer 640 is grown on the surface epitaxial layer 690 at a temperature of between about 800 and 950C to a thickness of between about 3 and 15 nanometers. As shown 6H, after gate oxide layer 640 has been formed, a gate electrode layer 642 of polysilicon is deposited over the surface to a thickness of between about 50 and 300 nanometers. On this layer, a resist mask is defined to protect the transistor gate region. Then, the exposed polysilicon is selectively etched and the resist mask is removed. The exposed gate oxide can, optionally, also be removed to provide the structure shown FIG. 6H.

As described, the gate dielectric is a single layer of silicon dioxide. However, in alternative embodiments, it may also be a multi-layer structure including silicon nitride.

Figure 6I:
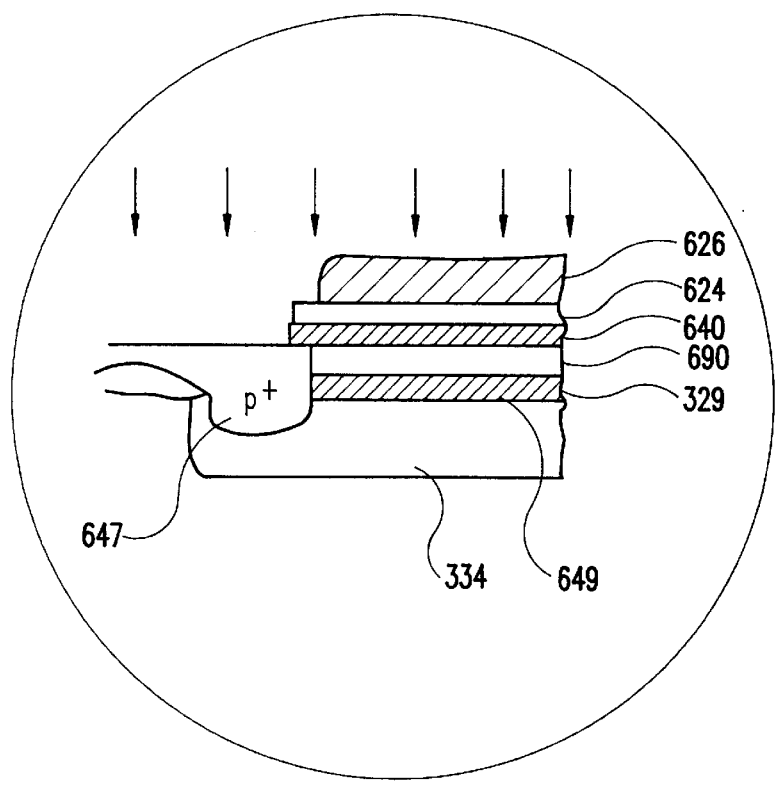

A mask 626 is now formed on the substrate from the polysilicon layer 642 along the right side (a drain side) of the partially fabricated MOS device as shown in FIG. 6I. Next, a p-type halo implant is conducted at an energy and dosage sufficient to form a retrograde pocket region 647 having a concentration profile as described above. For example, the pocket region might be formed with boron implanted at about $5\times10^{11}$ to $1\times10^{13}$ cm−2 at an energy of between about 20 and 120 keV. Typically, the implant will be performed under conditions which cause the pocket region 647 to extend slightly under the gate oxide 640 as shown. For example, implant might conducted at an angle. In some embodiments, indium may be an appropriate pocket dopant because this element has a relatively small diffusion coefficient and therefore is likely to form pockets having rather steep concentration profiles. In the case of a PFET, antimony may be used because it too has relatively small diffusion coefficient.

Figure 6J:
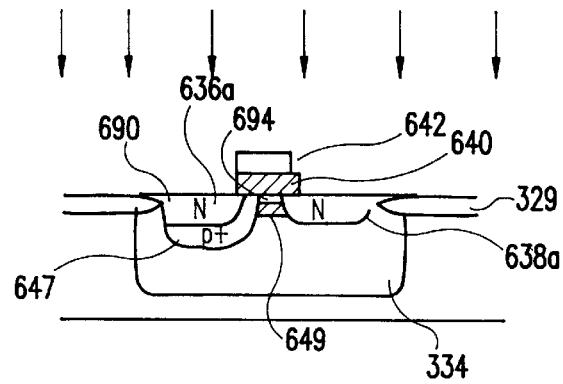

After forming pocket region 647, mask 626 is removed. Then as shown in FIG. 6J, an n-type ion implant is conducted at an ion dose of about $10^{13}$–$10^{14}$ cm−2 and an ion kinetic energy of between about 20 and 60 keV with ions drawn from P, As, Sb, or Sn. This implant is performed over the entire substrate, penetrating the p-well portion of the apparatus to form two n doped layers 636A and 638A flanking a p-type channel region 644 to the left and right, respectively, within the p-well 334. This implant is intended to form a device's source and drain "tip" regions which extend to the edge of the channel region. As shown, a p-type pocket region 647 partially remains below the source tip region 636A. In some embodiments, the junctions between these tip regions and the adjacent channel region have steep dopant concentration gradients. Thus, subsequent processing should be conducted under conditions which minimize dopant diffusion in these tip regions. To the extent possible, this will generally require conducting subsequent heating steps at relatively low temperatures and for relatively short times, or by using rapid thermal annealing ("RTA") as is known by those of skill in the art.

Figure 6K:
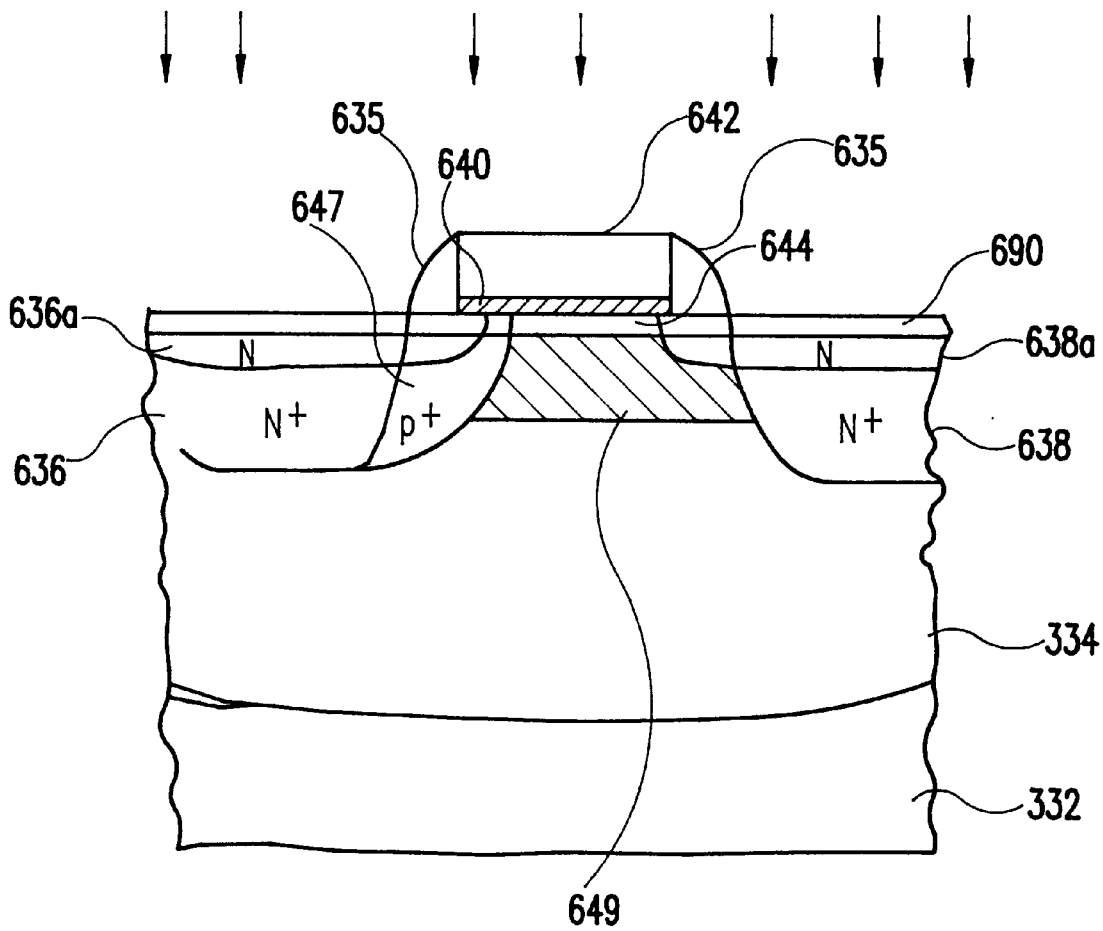

Next, "plug" regions 636 and 638 of the source and drain as shown in FIG. 6K are formed as follows. Initially, a blanket oxide insulating layer is deposited over the device.

Most of this layer is then anisotropically etched away, leaving side wall insulating spacers 635 of width 0.05–0.3 μm, flanking the polysilicon gate 642 on the right and left as shown in FIG. 6K. Thereafter, an n-type ion implant (ion dose=$1\times10^{15}$–$5\times10^{15}$ cm–2; ion kinetic energy=50–100 keV; ions drawn from P, As, Sb, or Sn) is performed over the substrate, penetrating the p-well portion of the structure. This produces drain and source plugs 636 and 638 of increased n-type doping. After drain and source layers 636 and 638 have been formed, an anneal step is performed. As can be seen in FIG. 6K, after the plug regions of the source and drain are formed, an asymmetric pocket region 647 remains partially under and partially adjacent source tip 636A and the channel region.

As with the embodiment discussed in FIGS. 5A–5I, in some embodiments, only a single anneal step is conducted for the pocket, tip, and plug implants. Preferably, it is conducted after all of these steps are completed. In other words, no anneal step is performed immediately after the asymmetric pocket and tip implants. This limited annealing allows the pocket and tip regions to maintain relatively steep concentration gradients near the channel region.

As also discussed with the embodiment in FIGS. 5A–5I, after the source and drain regions have been implanted and annealed as desired, an insulating layer is formed over the device, and apertures or vias are selectively etched and filled with metal, such as aluminum, tungsten, titanium or other electrically conductive material to provide electrical contacts for the various device elements.

As with the embodiment of FIGS. 5A–5I, various techniques are available for forming the electrical contacts/ties. In one approach, after the apertures/vias have been formed, a titanium (Ti) layer is conformally deposited over the structure. Thereafter, a titanium nitride (TiN) layer is conformally deposited over the Ti layer. Next, the MOS device is subjected to a rapid thermal anneal (RTA) step to cause some Ti from the Ti layer to diffuse into the source, drain, gate, and pocket regions and form titanium silicide ohmic contacts.

As discussed above, following the RTA, a blanket layer of tungsten (W) is deposited over the partially fabricated chip at a temperature of typically about 450C followed by an etchback process removing all the blanket W layer except a plug in the aperture. Next, a second TiN barrier layer is deposited over the tungsten filled vias. At this point, the upper surface of the structure is relatively flat and contains no unfilled vias. On this surface, an aluminum metallization layer is now deposited, overlying the second barrier layer. This layer is subsequently patterned to connect the vertical ties with horizontal conductive lines such as those that control the potential of the pocket region 647.

Of course, those of skill in the art will recognize the process described above can be varied in several different ways to achieve the same, or substantially similar results. For instance, one variant process can involve: first counter doping directly into the substrate 332 surface; applying an epitaxial layer similar to layer 690; and then proceeding with the remaining steps shown in FIGS. 5A–5E (forming isolation), and then proceeding with the process as shown in either FIGS. 5F–5I or 6E–6K (device formation). In addition, newer methods of isolation formation, such as shallow trench isolation can also be employed with the method of the invention. Consequently, the steps discussed above are merely illustrative and not to be construed as limiting the invention.

Typically, the above processes are performed at many locations on a single substrate so that multiple MOS devices are formed simultaneously to produce an integrated circuit.

Conclusion

Although certain embodiments of the present invention have been described, it should be understood that the present invention may be embodied in many other specific forms without departing from the spirit or scope of the invention. Particularly, the asymmetric NFETs illustrated above can be replaced with asymmetric PFETs. Further, the devices of this invention can be implemented in an SOI (silicon on insulator) structure rather than the bulk-silicon-based structure described above. SOI structures include a base layer of bulk silicon on top of which is provided a layer of bulk silicon dioxide. Finally, on top of the silicon dioxide layer, a thin epitaxial layer of silicon, typically in the range of 70 to 2000 angstroms, is provided to form the device elements (source, drain, and channel region). Still further, the devices of this invention may be operated over a wide range of temperatures. At low temperatures, the mean free path of electrons in silicon increases so that more electrons are transported ballistically, thereby potentially improving performance. Therefore, the present examples are to be considered as illustrative and not restrictive, and the invention is not to be limited to the details given herein, but may be modified within the scope of the appended claims.

What is claimed is:

1. A method of forming an asymmetric MOS device on a semiconductor substrate having a top surface, the method comprising the following steps:

forming a bulk region having a first conductivity type in said top surface, said bulk region having a bulk region dopant concentration;

implanting a counter dopant of a second conductivity type at the surface of the bulk region;

forming an epitaxial layer on the top surface of the semiconductor substrate and bulk region;

forming a gate over the epitaxial layer, a portion of the epitaxial layer immediately underlying the gate defining a channel region;

forming a pocket region of the first conductivity type extending into a portion of the bulk region, the pocket region having a dopant concentration that is greater than the bulk region dopant concentration and the epitaxial layer; and forming source and drain regions of a second conductivity type separated by the channel region, wherein the pocket region abuts one of said source or drain regions, and wherein the concentration of dopant atoms of the first conductivity type in the pocket region has a profile that increases with distance from the semiconductor substrate top surface such that the concentration of dopant atoms of the first conductivity type is lower in the channel region than in a region immediately below the channel region.

2. The method of claim 1 wherein said step of forming the pocket region includes a step of implanting ions of said first conductivity type on one side of said channel region under conditions such that the pocket region has a maximum concentration of dopant atoms of the first conductivity type in the channel region of at most about $10^{17}$ cm–3.

3. The method of claim 2 wherein said step of forming the pocket region includes a step of implanting ions of said first conductivity type on one side of said channel region under conditions such that the pocket region has a maximum concentration of dopant atoms of the first conductivity type in the channel region of between about $10^{14}$ and $10^{16}$ cm–3.

4. The method of claim 1 wherein said step of forming the pocket region includes a step of implanting ions of said first conductivity type on one side of said channel region under conditions such that the pocket region has a maximum concentration of dopant atoms of the first conductivity type below the channel region of at least about $10^{16}$ cm-3.

5. The method of claim 1 wherein said step of forming the pocket region includes a step of implanting ions of said first conductivity type on one side of said channel region under conditions such that the pocket region has a maximum concentration of dopant atoms located at least about 0.02 $\mu$m below the top surface of the semiconductor substrate.

6. The method of claim 1 wherein the step of forming the pocket region of the first conductivity type includes an ion implantation step conducted at a dose of between about $5\times10^{11}$ and $1\times10^{13}$ cm-2 and at an energy of between about 20 and 120 keV.

7. A method of forming an asymmetric MOS device on a semiconductor substrate having a top surface, the method comprising the following steps:

forming a bulk region having a first conductivity in said top surface, said bulk region having a bulk region dopant concentration;

forming a buried counter dopant region of a second conductivity type having a peak dopant concentration located below the surface of the semiconductor substrate;

forming a gate over the surface of the semiconductor substrate and above the buried counter dopant region, a portion of the substrate immediately underlying the gate and overlying the counter dopant region defining at least a portion of a channel region;

forming a pocket region of the first conductivity type extending into a portion of the bulk region, the pocket region having a dopant concentration that is greater than the bulk region dopant concentration and the channel region; and forming source and drain regions of a second conductivity type separated by the channel region, wherein the pocket region abuts one of said source and drain regions, and wherein the concentration of dopant atoms of the first conductivity in the pocket region has a profile that increases with distance from the semiconductor substrate top surface such that the concentration of dopant atoms of the first conductivity type is lower in the channel region than in a region immediately below the channel region;

wherein said buried counter dopant region is located in or abutting said channel region and extends at least part of the way from the drain to the source, whereby a conduction path of zero vertical electric field is produced within the channel region and above the counter dopant region while the MOS device is on.

8. The method of claim 7 wherein said step of forming the buried counter dopant region includes a step of implanting ions of said second conductivity type in the bulk region under conditions such that the buried counter dopant region has a maximum concentration located at a distance of between about 0.02 and 0.15 $\mu$m from the semiconductor substrate's top surface.

9. The method of claim 7 wherein said step of forming the buried counter dopant region is performed under conditions such that the dopant concentration in the buried counter dopant region has a maximum net dopant concentration of the second conductivity type of at least about $10^{17}$ cm-3.

10. The method of claim 7 wherein said step of forming the buried counter dopant region includes a step of implanting ions of said second conductivity type in the bulk region at a dose of between about $5\times10^{11}$ to $1\times10^{13}$ and at an energy of between about 20 and 200 keV.

11. The method of claim 1 wherein the MOS device is formed under conditions such that a ratio of on current to off current in the MOS device is not greater than about $10^5$.

12. The method of claim 1 wherein multiple MOS devices are formed on the semiconductor substrate such that an integrated circuit is formed.

13. The method of claim 1 wherein the step of forming an epitaxial layer forms an epitaxial layer having a thickness of between about 50 and 200 Å.

* * * * *